United States Patent
de la Garza et al.

(10) Patent No.: US 9,468,986 B2
(45) Date of Patent: Oct. 18, 2016

(54) METHODS OF FORMING ARTICLES INCLUDING METAL STRUCTURES HAVING MAXIMIZED BOND ADHESION AND BOND RELIABILITY

(71) Applicant: GLOBALFOUNDRIES, Inc., Grand Cayman (KY)

(72) Inventors: Ernesto Gene de la Garza, Dresden (DE); Martin O'Toole, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 518 days.

(21) Appl. No.: 13/954,444

(22) Filed: Jul. 30, 2013

(65) Prior Publication Data

US 2015/0037603 A1    Feb. 5, 2015

(51) Int. Cl.

| | |
|---|---|
| *B23K 1/20* | (2006.01) |
| *H05K 3/34* | (2006.01) |
| *H05K 13/04* | (2006.01) |
| *H01L 23/00* | (2006.01) |
| *C23C 28/00* | (2006.01) |
| *C23C 28/02* | (2006.01) |
| *H05K 3/38* | (2006.01) |
| *B32B 15/04* | (2006.01) |
| *B32B 3/10* | (2006.01) |

(52) U.S. Cl.
CPC ............... *B23K 1/20* (2013.01); *C23C 28/00* (2013.01); *C23C 28/02* (2013.01); *H01L 24/05* (2013.01); *H01L 24/43* (2013.01); *H01L 24/48* (2013.01); *H05K 3/385* (2013.01); *H01L 24/45* (2013.01); *H01L 2224/43* (2013.01); *H01L 2224/451* (2013.01); *H01L 2224/85365* (2013.01); *H01L 2224/85385* (2013.01); *H05K 2203/0307* (2013.01); *H05K 2203/0392* (2013.01); *H05K 2203/1105* (2013.01); *Y10T 428/12396* (2015.01)

(58) Field of Classification Search
CPC ............... C23C 28/00; C23C 28/02; Y10T 428/12396; Y10T 428/12472; Y10T 428/12993; Y10T 428/12736; Y10T 428/12743; Y10T 428/1275; Y10T 428/12757; Y10T 428/12764

See application file for complete search history.

(56) References Cited

U.S. PATENT DOCUMENTS

| | | | | |
|---|---|---|---|---|
| 6,045,892 A | * | 4/2000 | Lee | ............... H01L 21/76841 257/751 |
| 2009/0163022 A1 | * | 6/2009 | Lee | ............... H01L 27/12 438/648 |

OTHER PUBLICATIONS

Nils Kristensen et al., "Grain collapses in strained aluminum thin films," Journal of Applied Physics, vol. 69, Issue 4, pp. 1-8, (1991).
Morten Dahlstrøøm, "Effect of Copper Content on etching Response of Aluminum in Alkaline and Acid Solutions," Norwegian University of Science and Technology Department of Materials Science and Engineering, pp. 1-69 (2012).

* cited by examiner

*Primary Examiner* — Michael E La Villa
(74) *Attorney, Agent, or Firm* — Lorenz & Kopf, LLP

(57) ABSTRACT

Methods of effecting bond adhesion between metal structures, methods of preparing articles including bonded metal structures, and articles including bonded metal structures are provided herein. In an embodiment, a method of effecting bond adhesion between metal structures includes forming a first metal structure on a substrate. The first metal structure includes grains that have a {111} crystallographic orientation, and the first metal structure has an exposed contact surface. Formation of an uneven surface topology is induced in the exposed contact surface of the first metal structure after forming the first metal structure. A second metal structure is bonded to the exposed contact surface of the first metal structure after inducing formation of the uneven surface topology in the exposed contact surface.

16 Claims, 2 Drawing Sheets

METHODS OF FORMING ARTICLES INCLUDING METAL STRUCTURES HAVING MAXIMIZED BOND ADHESION AND BOND RELIABILITY

TECHNICAL FIELD

The technical field generally relates to methods of effecting bond adhesion between metal structures, methods of preparing an article including bonded metal structures, and articles including bonded metal structures. More particularly, the invention relates to methods of maximizing bond adhesion and bond reliability between metal structures through modification of surface topology in at least one of the metal structures.

BACKGROUND

Adhesion and reliability of bonds between metal structures, such as a wire bond between a bond pad and a wire or a bond interface between metal interconnects in an integrated circuit, are primary concerns within articles that include electronic devices. Various factors may impact the adhesion and reliability of the bonds, such as but not limited to the presence of surface contaminants, surface topology of the metal structures, and chemistry of the metal structures to be bonded.

Efforts to maximize adhesion between the metal structures have focused on chemical surface treatment to minimize or eliminate surface contaminants that could lead to corrosion (thereby reducing reliability) or that negatively influence adhesion. However, chemical surface treatment alone is insufficient to maximize adhesion and reliability of the bonds. Further, some chemical surface treatments have an undesirable result of introducing chemically stable surface species on contact surfaces of the metal structures that are to be bonded, and the chemically stable surface species may impeded kinetics of bond formation between the metal structures or may otherwise impact desired formation of the bond. For example, wet or dry chemical processing of contact surfaces is often conducted, e.g., using various acids or halogenated compounds (depending upon the particular materials of the contact surfaces) to remove metal oxides from the contact surfaces. Particularly when fluorine-containing etchants are employed, such chemical processing may give rise to fluorine-doped metal oxides, which are chemically stable and deter corrosion, but which also mask surface morphology of the contact surface and may slow adhesion kinetics.

Adhesion and reliability of bonds between metal structures, such as a wire bond between a bond pad and a wire or a bond interface between metal interconnects in an integrated circuit, are primary concerns within articles that include electronic devices. Various factors may impact the adhesion and reliability of the bonds, such as but not limited to the presence of surface contaminants, surface topology of the metal structures, and chemistry of the metal structures to be bonded.

Alloying or doping of the metal structures, i.e., modification of the chemistry of the metal structures to be bonded, has also been employed to promote intermetallic formation during bonding between the metal structures. However, alloying or doping may require expensive target retrofitting and extensive reliability requalification for the bonded metal structures.

Accordingly, it is desirable to provide methods of effecting bond adhesion between metal structures with maximized bond adhesion and reliability between the metal structures, and articles that include metal structures bonded with maximized bond adhesion and reliability, in addition to or as an alternative to the approaches that involve chemical surface treatment and/or alloying or doping of the metal structures. Furthermore, other desirable features and characteristics of the present invention will become apparent from the subsequent detailed description of the invention and the appended claims, taken in conjunction with the accompanying drawings and this background of the invention.

BRIEF SUMMARY

Methods of effecting bond adhesion between metal structures, methods of preparing articles including bonded metal structures, and articles including bonded metal structures are provided herein. In an embodiment, a method of effecting bond adhesion between metal structures includes forming a first metal structure on a substrate. The first metal structure includes grains that have a $\{111\}$ crystallographic orientation, and the first metal structure has an exposed contact surface. Formation of an uneven surface topology is induced in the exposed contact surface of the first metal structure after forming the first metal structure. A second metal structure is bonded to the exposed contact surface of the first metal structure after inducing formation of the uneven surface topology in the exposed contact surface.

In another embodiment, a method of preparing an article that includes bonded metal structures includes providing a substrate. An electronic device is formed on the substrate. A first metal structure is formed on the substrate, and the first metal structure is in electrical communication with the electronic device. The first metal structure includes grains that have a $\{111\}$ crystallographic orientation, and the first metal structure has an exposed contact surface. Formation of an uneven surface topology is induced in the exposed contact surface of the first metal structure after forming the first metal structure. A second metal structure is bonded to the exposed contact surface of the first metal structure after inducing formation of the uneven surface topology in the exposed contact surface.

In another embodiment, an article that includes bonded metal structures is provided. The article includes a substrate and a first metal structure that is disposed on the substrate. The first metal structure has an exposed contact surface that has an uneven surface topology including hillocks or collapsed grains. A second metal structure is bonded to the exposed contact surface of the first metal structure that has the uneven surface topology.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
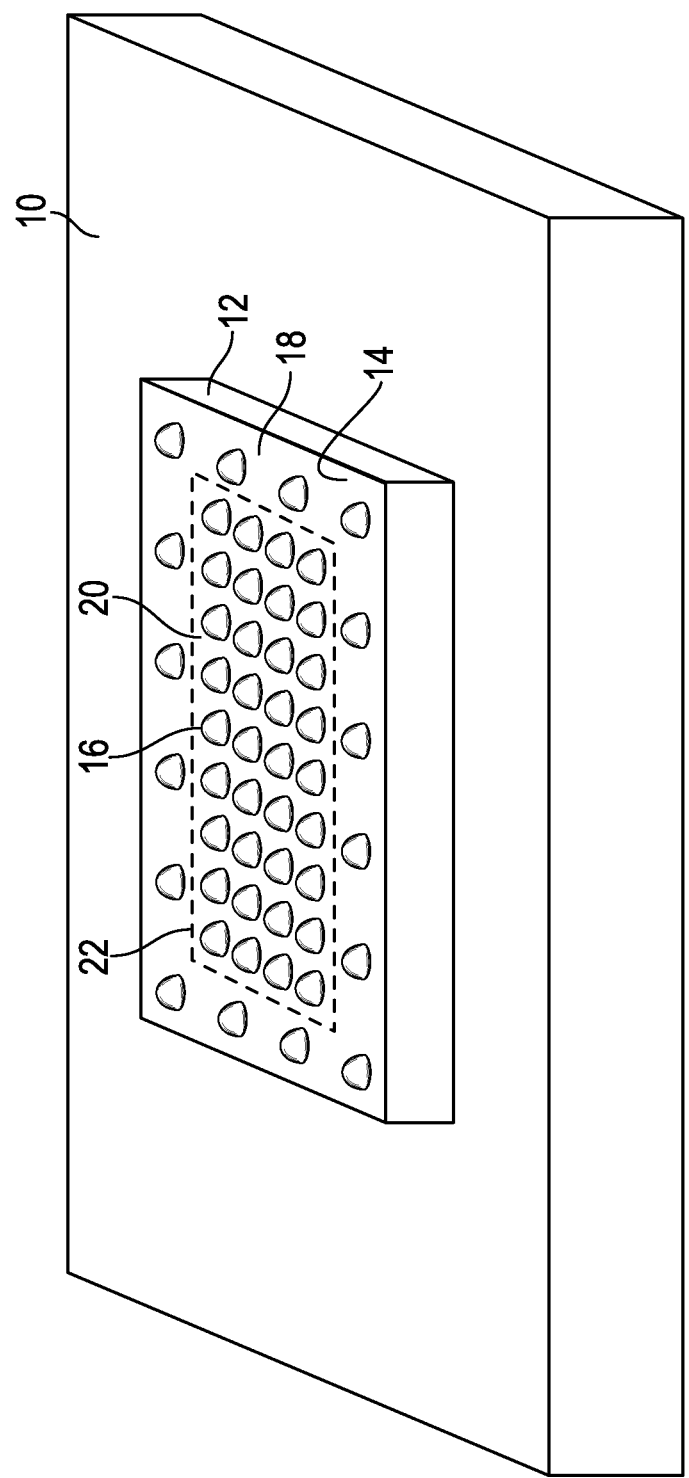
FIG. 1 is a schematic perspective view of a first metal structure formed on a substrate in accordance with an embodiment.

The following detailed description is merely exemplary in nature and is not intended to limit the various embodiments or the application and uses thereof. Furthermore, there is no intention to be bound by any theory presented in the preceding background or the following detailed description.

Methods of effecting bond adhesion between metal structures, methods of preparing an article that includes bonded metal structures, and articles that include bonded metal structures are provided herein. In particular, the methods of effecting bond adhesion between the metal structures may be employed, for example, within the methods of preparing the article that includes bonded metal structures. In accordance with the methods described herein, bond adhesion between the metal structures is maximized by inducing uneven surface topology in a first metal structure that is formed on a substrate. By "inducing uneven surface topology", it is meant that deposition and/or post deposition conditions for the first metal structure are managed in a way that gives rise to surface defects such as hillocks and/or collapsed grains in an exposed contact surface of the first metal structure. The "exposed contact surface" refers to a surface of the first metal structure to which a second metal structure is to be bonded. Formation of hillocks and/or collapsed grains may be managed through forming a distribution of grains having particular crystallographic orientations that are known to produce hillocks and/or collapsed grains during thermal treatment. For example, it is generally known that grains having a {111} crystallographic orientation are prone to hillock formation and/or grain collapse through stress release mechanisms that may occur during temperature cycling. In conventional metal structure formation techniques where grain orientation is actively controlled, deposition and post deposition conditions that promote formation of grains that have non-{111} crystallographic orientations in exposed surfaces of the metal structures are generally employed because an uneven surface topology is generally considered aesthetically undesirable. However, for the methods and articles described herein, the uneven surface topology may be exploited to maximize bond adhesion and bond reliability between the metal structures by providing more bonding surface area, as compared to an even surface topology. Further, inducement of the uneven surface topology through formation of the hillocks and/or collapsed grains provides an expedient and controllable mechanism for providing the uneven surface topology without reliance upon underlying contours of the substrate upon which the first metal structure is formed.

An exemplary embodiment of a method of effecting bond adhesion between metal structures will now be described with reference to FIGS. 1 and 2. In accordance with an embodiment, a substrate 10 is provided. The substrate 10 is not particularly limited and may be any substrate 10 upon or within which any metal structure may be formed. In an embodiment, the substrate 10 includes semiconductor or dielectric material, which materials are particularly useful in layers of integrated circuits. Examples of suitable dielectric materials include, but are not limited to, oxides and nitrides such as, for example, a silicon oxide or a silicon nitride, respectively.

A first metal structure 12 is formed on the substrate 10. For example, in an embodiment and as shown in FIGS. 1 and 2, the first metal structure 12 is formed on the substrate 10. In another embodiment and referring momentarily to FIG. 3, the first metal structure 312 is formed on the substrate 310. The first metal structure 12 has an exposed contact surface 14. Although not shown in the Figures, the first metal structure 12 is formed to include grains that have a {111} crystallographic orientation, as denoted using the Miller Index. In particular, the first metal structure 12 is formed to intentionally include the grains that have the {111} crystallographic orientation at the exposed contact surface 14. Crystallographic orientation of grains in the first metal structure 12, in particular crystallographic orientation of grains at the exposed contact surface 14, is determinative of the formation of an uneven surface topology in the first metal structure 12 as described in further detail below. Without being bound to any particular theory, it is believed that generation of stress and stress relaxation in the first metal structure 12 generally results in deformation of the first metal structure 12 at the grains having the {111} crystallographic orientation, with those grains forming hillocks 16 when the first metal structure 12 is under compressive stress and with grain collapse occurring at those grains when the first metal structure 12 is under tensional stress to form a dimpled topography. For illustrative purposes only, FIG. 1 schematically shows hillocks 16 formed in the exposed contact surface 14 of the first metal structure 12, although it is to be appreciated that collapsed grains (in the form of dimples, not shown) could alternatively be formed.

In an embodiment, the first metal structure 12 is formed by depositing metal of the first metal structure 12 and managing deposition conditions to yield the grains having the {111} crystallographic orientation in a desired amount to achieve appreciable hillock formation and grain collapse. The amount of grains having the {111} crystallographic orientation is determined empirically, such as through optical analysis of a scanning electron micrograph of the exposed contact surface 14 of the first metal structure 12. In an embodiment, the grains having the {111} crystallographic orientation are present in an amount of from about 5 to about 20%, based on a total number of all grains in the exposed contact surface 14 of the first metal structure 12 as determined through optical analysis of a scanning electron micrograph of the exposed contact surface 14 of the first metal structure 12.

In an embodiment and as shown in FIG. 1, the exposed contact surface 14 of the first metal structure 12 has a peripheral region 18 and a body region 20 that is enclosed by the peripheral region 18. In this embodiment, the first metal structure 12 is formed with a greater density of grains that have the {111} crystallographic orientation in the body region 20 than in the peripheral region 18 as determined through optical analysis of a scanning electron micrograph of the first metal structure 12. As a result and as schematically shown in FIG. 1, more hillocks 16 or collapsed grains will be present in the body region 20 than in the peripheral region 18, with a boundary 22 between the regions denoted by an optically discernable change in density of hillocks 16 or collapsed grains in the exposed contact surface 14.

Formation of particular crystallographic orientations in the first metal structure 12 are dependent upon various factors including, but not limited to, chemistry of the metal that is deposited, deposition temperature, post-deposition thermal treating temperature and time, bias conditions, and atmosphere within which deposition is conducted. Those of skill in the art generally recognize the appropriate conditions that promote formation of grains having particular crystallographic orientations based on chemistry of the metal that is deposited, although a distribution of grains having different crystallographic orientations is generally yielded with relative amounts of grains having different crystallographic orientations being capable of modification.

The chemistry of the metal that is deposited to form the first metal structure 12 may be dependent upon the particular application for the resulting first metal structure 12. In various embodiments, aluminum or copper are included in the first metal structure 12 as the primary elements, i.e., aluminum or copper may be present in the first metal structure 12 in an amount of at least 50 weight %, based on the total weight of the first metal structure 12. For example, when the first metal structure 12 is a bond pad as shown in FIG. 2, the first metal structure 12 may include aluminum present as the primary element. In other embodiments, such as when the first metal structure 12 is an interconnect as shown in FIG. 3, the first metal structure 12 may include copper present as the primary element. It is to be appreciated that other metals may also be used as the primary element for the first metal structure 12, although conditions for obtaining grains of various crystallographic orientations in materials that primarily include aluminum or copper are best documented. In an embodiment, the first metal structure 12 includes substantially pure aluminum or copper, i.e., with 99.9 weight % or greater purity. In other embodiments, the first metal structure 12 includes a metal alloy. For example, the first metal structure 12 may include an alloy of aluminum and copper. As an example, a suitable alloy of aluminum and copper includes from about 99.0 to about 99.9 weight % aluminum, and from about 0.1 to about 1.0 weight % copper, both based on the total weight of the first metal structure 12. A specific example of a suitable alloy of aluminum and copper includes about 99.5 weight % aluminum and about 0.5 weight % copper, both based on the total weight of the first metal structure 12, with +/−0.1 weight % deviations permissible for the above amounts and encompassed by the term "about".

As alluded to above, the deposition conditions are managed to yield the grains having the {111} crystallographic orientation in the desired amounts, and conditions that are managed may include bias conditions, atmosphere, and deposition temperature during deposition of the metal of the first metal structure 12. Using the specific alloy of aluminum and copper that includes about 99.5 weight % aluminum and about 0.5 weight % copper, examples of suitable deposition conditions include the following: Physical Vapor Deposition (PVD) at a temperature range of from about 150 to about 495° C. and power settings ranging from about 5 to about 70 kW. Employing such deposition conditions, a yield of grains that have the {111} crystallographic orientation can be expected to be from about 1 to about 20%, based on the total number of grains in the first metal structure 12.

Post deposition conditions may also contribute to formation of crystallographic orientation of grains in the first metal structure 12. In an embodiment, post deposition thermal budget is managed to yield desired crystallographic orientation of grains in the first metal structure 12, with the thermal budget controlled to promote formation and distribution of the grains having the {111} crystallographic orientation via thermal and/or stress-induced material transport within the first metal structure 12. "Thermal budget", as referred to herein, is a total amount of thermal energy that is transferred to the first metal structure 12 during post-deposition thermal treatment, and is proportional to temperature and duration of post-deposition thermal treatment.

Thickness of the first metal structure 12 may have an impact on later formation of desired uneven surface topography in the exposed contact surface 14 of the first metal structure 12. In an embodiment, the first metal structure 12 is formed having a thickness of from about 0.5 to about 4.0 µm, such as from about 1.0 to about 3.2 µm.

Formation of an uneven surface topology in the exposed contact surface 14 of the first metal structure 12 is induced after forming the first metal structure 12. In particular, through a combination of inducing stress in the first metal structure 12 and relieving the stress, hillocks 16 or collapsed grains are formed in the exposed contact surface 14 of the first metal structure 12 with the hillocks 16 or collapsed grains providing either a bumpy or dimpled surface topology as the uneven surface topology that is referred to herein. It is to be appreciated that stress may be generated within the first metal structure 12, either during or after formation of the grains in the first metal structure 12. However, at least relief of the stress in the first metal structure 12 occurs after formation of the grains in the first metal structure 12, due to the mechanism by which the hillocks 16 or collapsed grains are formed relying upon stress relief at the grains having the {111} crystallographic orientation.

In an embodiment, the first metal structure 12 may be heat treated to generate stress in the first metal structure 12, although in other embodiments stress may be mechanically generated. Heat treatment may involve one or more cycles of annealing and quenching to generate a desired type and degree of stress within the first metal structure 12. Depending upon annealing times and temperatures, as well as quenching rates, compressive stress or tensive stress may be generated in the first metal structure 12. For example, in an embodiment, the first metal structure 12 is heat treated under conditions that generate compressive stress within the first metal structure 12, and the compressive stress is relaxed through hillock formation in the exposed contact surface 14. As another example, in another embodiment, the first metal structure 12 is heat treated under conditions that generate tensive stress within the first metal structure 12, and the tensive stress is relaxed through grain collapse in the exposed contact surface 14. Conditions for generating compressive stress or tensive stress in the first metal structure 12, and that can give rise to hillock formation or grain collapse, can readily be determined by those of skill in the art based upon the particular materials used for the first metal structure 12. Hillock formation generally occurs at an elevated temperature through relaxation of the first metal structure 12 when under compressive stress. Grain collapse generally occurs very suddenly, in one second or less, as stress and temperature reach critical levels during heat treatment of the first metal structure 12 when under tensive stress. Further, under circumstances where the first metal structure 12 is formed with a greater density of grains having the {111} crystallographic orientation in the body portion than in the peripheral region 18, the body region 20 will also have a greater density of hillocks 16 or collapsed grains than the peripheral region 18, as schematically shown in FIG. 1.

After inducing formation of the uneven surface topology, the first metal structure 12 is optionally etched to remove oxides or other surface contaminants from the exposed contact surface 14. The optional etching may be conducted prior to bonding a second metal structure 24 to the exposed contact surface 14 of the first metal structure 12, as described in further detail below. Conventional etchants and etchant techniques may be employed, based upon the material of the first metal structure 12. For example, when the first metal structure 12 includes aluminum as the primary element, wet etching may be conducted using a mixture of phosphoric acid, acetic acid, nitric acid, and water, or plasma etching may be conducted using $Cl_2$, $CCl_4$, $SiCl_4$, or $BCL_3$. As another example, when the first metal structure 12 includes copper as the primary element, wet etching may be conducted using HF or citric acid.

Figure 2:
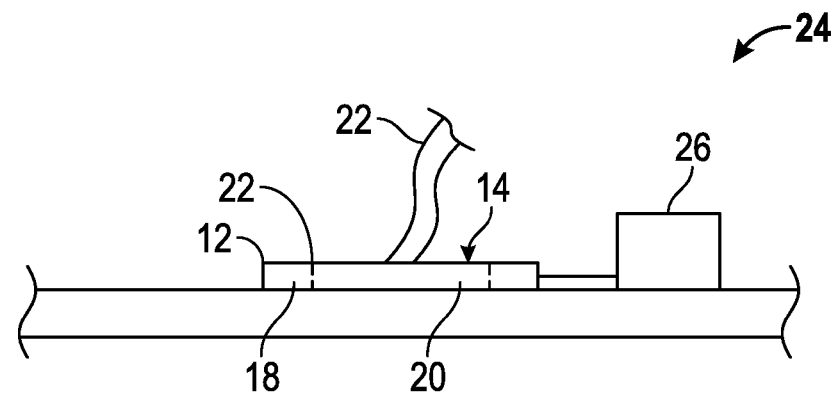
FIG. 2 is a cross-sectional side view of an article including a first metal structure formed on a substrate and a second metal structure bonded to the first metal structure in accordance with an embodiment.
Figure 3:
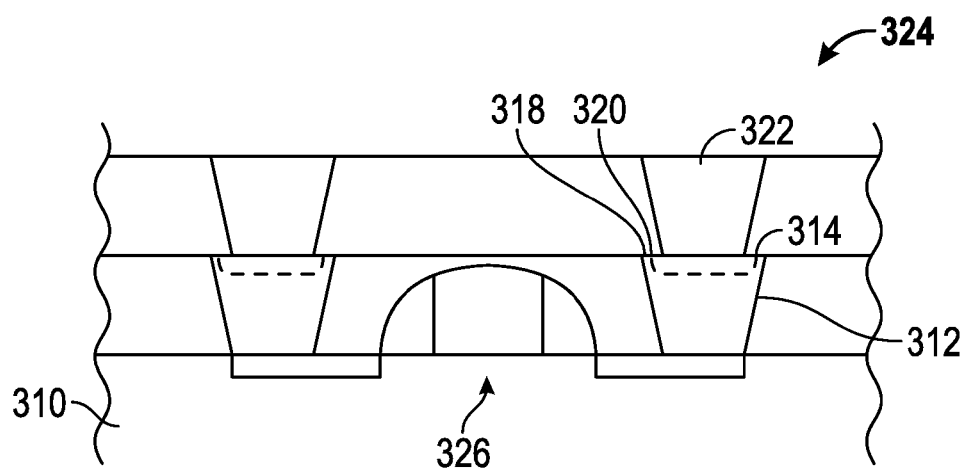
FIG. 3 is a cross-sectional side view of an article including a first metal structure formed in a substrate and a second metal structure bonded to the first metal structure in accordance with another embodiment.

A shown in FIGS. 2 and 3, the second metal structure 22, 322 is bonded to the exposed contact surface 14 of the first metal structure 12. In particular, the second metal structure 22, 322 is bonded to the first metal structure 12 after inducing formation of the uneven surface topology in the exposed contact surface 14. The uneven surface topology provides maximized bond adhesion and reliability by maximizing a bond surface area between the first metal structure 12, 312 and the second metal structure 22, 322, as compared to a planar contact surface. Conventional materials may be used for the second metal structure 22, 322, depending upon the materials of the first metal structure 12, 312 and depending upon the particular configuration of the first metal structure 12, 312 and the second metal structure 22, 322, and the materials of the second metal structure 22, 322 may be the same as or different from the materials of the first metal structure 12, 312.

In an embodiment and as shown in FIG. 2, the first metal structure 12 includes a bond pad that has the exposed contact surface 14 and the second metal structure 22 includes a wire that is bonded to the exposed contact surface 14 of the first metal structure 12. In another embodiment and as shown in FIG. 3, the first metal structure 312 includes a first interconnect that is disposed on the substrate 310 and the second metal structure 322 includes a second interconnect that overlies the first interconnect, with the second interconnect formed overlying the first interconnect and with a bond formed directly between the second interconnect and the exposed contact surface 314 of the first interconnect. In the embodiments of both FIG. 2 and FIG. 3, the second metal structure 322 may be bonded to the body region 320 of the exposed contact surface 314 with the peripheral region 318 free from a bond to the second metal structure 322. In this manner, maximized bond adhesion and reliability may be established due to the greater density of hillocks or collapsed grains in the body region 320 than in the peripheral region 318.

In embodiments, an article 24, 324 including bonded metal structures is prepared by effecting bond adhesion between the metal structures in the same manner as described above. In this embodiment, an electronic device 26, 326 is formed on the substrate 10, 310 and the first metal structure 12, 312 is formed on the substrate 10, 310 with the first metal structure 12, 312 in electrical communication with the electronic device 26, 326, with exemplary articles shown in FIGS. 2 and 3. The electronic device 26, 326 may be formed before or after formation of the first metal structure 12, 312, and may also be formed before or after bonding the second metal structure 22, 322 to the first metal structure 12, 312. Examples of suitable electronic devices 26, 326 that may be formed include, but are not limited to, transistors, capacitors, resistors, or the like.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of effecting bond adhesion between metal structures, the method comprising:
    forming a first metal structure on a substrate, wherein the first metal structure comprises grains having a {111} crystallographic orientation at an exposed contact surface of the first metal structure;
    inducing formation of an uneven surface topology in the exposed contact surface of the first metal structure after forming the first metal structure to give rise to surface defects in the exposed contact surface of the first metal structure; and
    bonding a second metal structure to the exposed contact surface of the first metal structure after inducing formation of the uneven surface topology in the exposed contact surface.

2. The method of claim 1, wherein the first metal structure comprises aluminum and wherein forming the first metal structure comprises forming the first metal structure comprising aluminum on the substrate.

3. The method of claim 2, wherein the first metal structure further comprises copper and wherein forming the first metal structure comprises forming the first metal structure comprising an alloy of aluminum and copper on the substrate.

4. The method of claim 1, wherein the first metal structure comprises copper and wherein forming the first metal structure comprises forming the first metal structure comprising copper on the substrate.

5. The method of claim 1, wherein forming the first metal structure comprises depositing metal of the first metal structure and managing deposition conditions to yield the grains having the {111} crystallographic orientation in an amount of from about 5 to about 20%, based on a total number of all grains in the exposed contact surface of the first metal structure.

6. The method of claim 1, wherein the exposed contact surface of the first metal structure has a peripheral region and a body region enclosed by the peripheral region, and wherein forming the first metal structure comprises forming the first metal structure with a greater density of grains having the {111} crystallographic orientation in the body region than in the peripheral region as determined through optical analysis of a scanning electron micrograph of the first metal structure.

7. The method of claim 1, wherein forming the first metal structure comprises controlling a thermal budget during formation of the first metal structure to promote formation and distribution of the grains having the {111} crystallographic orientation via thermal and/or stress-induced material transport within the first metal structure.

8. The method of claim 1, wherein forming the first metal structure comprises forming the first metal structure so as to have a thickness of from about 0.5 to about 4 µm.

9. The method of claim 1, wherein the first metal structure comprises a bond pad having the exposed contact surface and the second metal structure comprises a wire, and wherein bonding the second metal structure to the exposed contact surface of the first metal structure comprises bonding the wire to the exposed contact surface.

10. The method of claim 1, wherein the first metal structure comprises a first interconnect disposed on the substrate and the second metal structure comprises a second interconnect overlying the first interconnect, and wherein bonding the second metal structure to the exposed contact surface of the first metal structure comprises forming the second interconnect overlying the first interconnect.

11. The method of claim 1, wherein inducing formation of the uneven surface topology in the exposed contact surface of the first metal structure comprises heat treating the first metal structure.

12. The method of claim 11, wherein heat treating the first metal structure comprises heat treating the first metal structure under conditions that generate compressive stress within the first metal structure, and wherein inducing formation of the uneven surface topology further comprises relaxing the compressive stress through hillock formation in the exposed contact surface.

13. The method of claim 11, wherein heat treating the first metal structure comprises heat treating the first metal structure under conditions that generate tensive stress within the first metal structure, and wherein inducing formation of the uneven surface topology further comprises relaxing the tensive stress through grain collapse in the exposed contact surface.

14. The method of claim 11, wherein heat treating the first metal structure comprises annealing and quenching the first metal structure.

15. The method of claim 1, further comprising etching the exposed contact surface of the first metal structure prior to bonding the second metal structure thereto.

16. A method of preparing an article including bonded metal structures, the method comprising:
    providing a substrate;
    forming an electronic device on the substrate;
    forming a first metal structure on the substrate, wherein the first metal structure is in electrical communication with the electronic device, wherein the first metal structure comprises grains having a {111} crystallographic orientation at an exposed contact surface of the first metal structure;
    inducing formation of an uneven surface topology in the exposed contact surface of the first metal structure after forming the first metal structure to give rise to surface defects in the exposed contact surface of the first metal structure; and
    bonding a second metal structure to the exposed contact surface of the first metal structure after inducing formation of the uneven surface topology in the exposed contact surface.

* * * * *